United States Patent
Sender

(10) Patent No.: US 7,535,001 B2
(45) Date of Patent: May 19, 2009

(54) METHOD AND SYSTEM FOR FOCUSING A CHARGED PARTICLE BEAM

(75) Inventor: Benzion Sender, Modiin (IL)

(73) Assignee: Applied Materials, Israel, Ltd., Rehovot (IL)

(*) Notice: Subject to any disclaimer, the term of this patent is extended or adjusted under 35 U.S.C. 154(b) by 48 days.

(21) Appl. No.: 11/861,163

(22) Filed: Sep. 25, 2007

(65) Prior Publication Data

US 2008/0011964 A1 Jan. 17, 2008

Related U.S. Application Data

(62) Division of application No. 11/155,044, filed on Jun. 17, 2005, now Pat. No. 7,375,326.

(60) Provisional application No. 60/581,854, filed on Jun. 21, 2004.

(51) Int. Cl.
*G01N 23/00* (2006.01)
*G21K 7/00* (2006.01)

(52) U.S. Cl. .................. 250/310; 250/306; 250/307; 250/311; 250/201.1; 250/202.4; 250/492.2; 250/491.1; 250/492.22; 250/492.3; 250/396 ML; 250/396 R; 250/397; 315/370; 356/401; 356/372; 356/399; 430/30; 430/296; 355/55

(58) Field of Classification Search .............. 250/310, 250/306, 307, 311, 201.1, 202.4, 492.2, 491.1, 250/492.22, 492.3, 396 ML, 396 R, 397; 315/370; 356/401, 372, 399; 430/30, 296; 355/55

See application file for complete search history.

(56) References Cited

U.S. PATENT DOCUMENTS

| 5,621,739 | A | 4/1997 | Sine et al. ............ 371/22.1 |
|---|---|---|---|
| 6,337,488 | B1 | 1/2002 | Okawauchi |
| 6,541,747 | B1 | 4/2003 | Kikuchi et al. |
| 6,880,117 | B2 | 4/2005 | Lin et al. ............ 714/718 |
| 7,036,055 | B2 | 4/2006 | Muljuno et al. ......... 714/716 |
| 7,375,326 | B2* | 5/2008 | Sender ............... 250/310 |
| 2001/0007498 | A1 | 7/2001 | Arai et al. |
| 2001/0013110 | A1 | 8/2001 | Pierce et al. ............ 714/718 |
| 2002/0046379 | A1 | 4/2002 | Miki et al. ............ 714/749 |
| 2002/0199139 | A1 | 12/2002 | Dortu et al. ............ 714/718 |
| 2003/0178576 | A1 | 9/2003 | Pan et al. |
| 2004/0146295 | A1 | 7/2004 | Furman et al. |
| 2005/0060600 | A1 | 3/2005 | Jeddeloh ................. 714/5 |
| 2005/0144403 | A1 | 6/2005 | Jeddeloh ............... 711/154 |

FOREIGN PATENT DOCUMENTS

| EP | 01117129 | 7/2001 |
|---|---|---|
| WO | 2004063698 | 7/2004 |

* cited by examiner

*Primary Examiner*—Jack I Berman
*Assistant Examiner*—Meenakshi S Sahu
(74) *Attorney, Agent, or Firm*—Tarek N. Fahmi

(57) ABSTRACT

A method for focusing a charged particle beam, the method includes: (a) altering a focal point of a charged particle beam according to a first focal pattern while scanning a first area of a sample and collecting a first set of detection signals; (b) altering a focal point of a charged particle bean according to a second focal pattern while scanning a second area that is ideally identical to the first area and collecting a second set of detection signals; and (c) processing the first and second set of detection signals to determine a focal characteristic; whereas the first focal pattern and the second focal pattern differ by the location of an optimal focal point.

22 Claims, 7 Drawing Sheets

METHOD AND SYSTEM FOR FOCUSING A CHARGED PARTICLE BEAM

RELATED APPLICATION

This application is a Divisional Application of U.S. application Ser. No. 11/155,044 filed Jun. 17, 2005, now U.S. Pat. No. 7,375,326, which is related to and claims the priority benefit of U.S. Provisional Application 60/581,854, filed Jun. 21, 2004, incorporated herein by reference.

FIELD OF THE INVENTION

This invention relates to a charged particle system and a method for focusing a charged particle beam.

BACKGROUND OF THE INVENTION

Modern inspection, defect review and metrology tools use one or more charges particle beams in order to inspect, analyze and measure features or defects. The resolution of these systems is responsive to various parameters including the focus error, astigmatism and the like. Modern systems are also required to inspect, review or measure samples with an increased throughput. High throughput systems requires fast focus error detection methods.

As the size of features and defects gets smaller there is a need to provide an efficient method for determining focus errors.

SUMMARY OF THE INVENTION

A method for focusing a charged particle beam, the method includes: (a) altering a focal point of a charged particle beam according to a first focal pattern while scanning a first area of a sample and collecting a first set of detection signals; (b) altering a focal point of a charged particle beam according to a second focal pattern while scanning a second area that is ideally identical to the first area and collecting a second set of detection signals; and (c) processing the first and second set of detection signals to determine a focal characteristic; whereas the first focal pattern and the second focal pattern differ by the location of an optimal focal point.

Conveniently, the method can include applying the first and or second focal patterns during inspection sessions or between inspection sessions.

A system that includes: (i) illumination optics, adapted to alter a focal point of a charged particle beam according to a first focal pattern while scanning a first area of a sample; and adapted to alter a focal point of a charged particle beam according to a second focal pattern while scanning a second area that is ideally identical to the first area; (ii) at least one detector adapted to provide a first set of detection signals resulting from the scanning of the first area and adapted to provide a second set of detection signals resulting from the scanning of the second area; and (iii) a processor, adapted to process the first and second set of detection signals to determine a focal characteristic, whereas the first focal pattern and the second focal pattern differ by the location of an optimal focal point.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 6 includes a timing diagram illustrates the timing of an inspections periods and few short focus correction sessions are applied between;

DETAILED DESCRIPTION OF THE DRAWINGS

In the following detailed description of the preferred embodiments and other embodiments of the invention, reference is made to the accompanying drawings. It is to be understood that those of skill in the art will readily see other embodiments and changes may be made without departing from the scope of the invention.

According to various embodiments of the invention focal characteristics can be determines by applying one, two or more focal patterns. Some figures refer to a first and second focal pattern but the amount of focal patterns can vary. The two focal patterns can be a part of the same focal pattern.

According to an embodiment of the invention the focus can be change according to a focus pattern such as to enable to detect focus errors. The focus pattern can include small deviations from proper focus but this is not necessarily so.

The focus pattern can include large or moderate deviations from proper focus. According to an embodiment of the invention the focus pattern can be applied in a manner that allows to inspect areas that are imaged while focus changes occur, but this is not necessarily so. The local changes can occur during an inspection stage of a sample but this not necessarily so.

According to an embodiment of the invention the focus can be fixed during a scan of a certain sub-area or strip, while the focal point changes between different sub-areas of strips.

The focus pattern is applied while a certain region is scanned. The size of that region change from sample to sample, from scan to scan, from area to area.

According to an embodiment of the invention one or more characteristic of the focal pattern can be determined in response to focal errors that were previously detected, to the pattern or shape of the scanned sample, and the like.

Conveniently, the focus is changed along an imaginary first axis while the sample is translated along an traverse (conveniently perpendicular) axis. This is not necessarily so. The method can be applied in systems where the sample is stationary and a part of the inspection system moves. According to another embodiment of the invention the method can be applied while a rotational displacement is introduced between the sample and the inspection system.

Conveniently, the method includes collecting scattered charged particle beams from a sample, but this is not necessarily so.

The following figures refer to an inspection system. It is noted that the invention can be applied in other systems such as but not limited to metrology systems, review systems and the like.

The inventors inspected a wafer but other samples, such as but not limited to reticles can be scanned. It is further noted that the invention can be applied to transmissive inspection systems.

Figure 1:
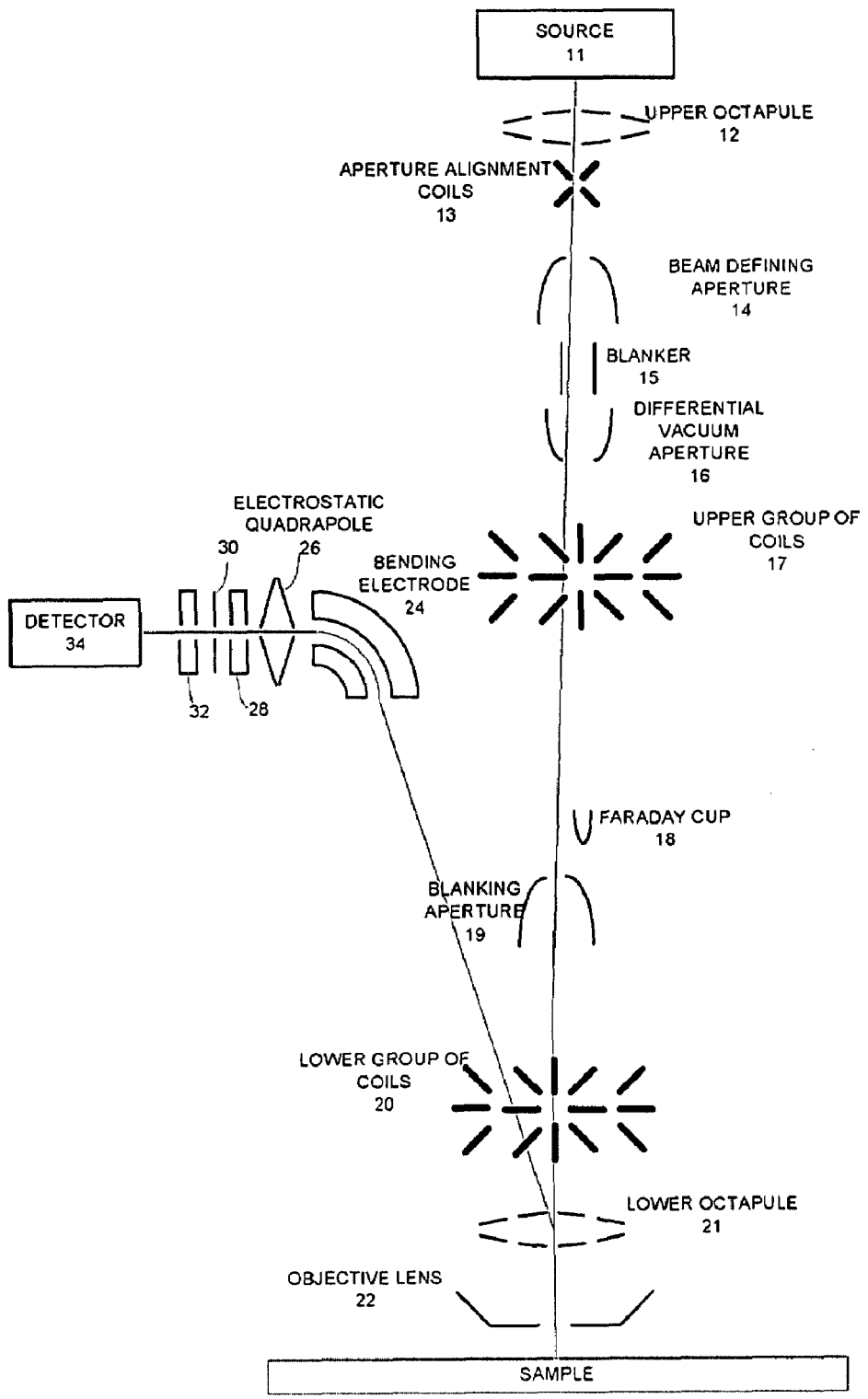
FIG. 1 illustrates a portion of a system for sample inspection, according to an embodiment of the invention.

FIG. 1 illustrates portion 10 of an inspection system, according to an embodiment of the invention. It is noted that various prior art charged particle beam devices, including devices that utilize one or more charged particle beams, can be used for applying the invention.

It is noted that such a prior art system has to be able to perform fast alteration of the focus point, and to be able to process the detections signals according to various embodiments of the invention. A fast focus alteration can be applied various times during a single scan of a slice of a sample. Conveniently, fast scan changes should not exceed a rate of 1 cm/sec.

Portion 10 includes many components. Some components are optional. The portion includes illumination optics an inspection optics. The illumination optics generate and direct a charged particle beam towards the sample. The focal point of the charges particle beam can be altered by various components of the illumination optics. The term "optics" includes components such as objective lenses, magnetic coils, polepieces, electrostatic lenses, apertures, scanners, and the like. These components affect various characteristics of the charged particle beam. The optics can also include the components such as power suppliers, current supply sources, components that control these components and the like.

The illumination path includes a charged particle beam source 11. The source 11 usually includes an electron gun, a filament, a suppressor, an extractor and an anode. The charged particle beam source 11 is followed by a upper octopole 12, aperture alignment coils 13, beam defining aperture 14, blanker 15, differential vacuum aperture 16, an upper group of coils 17, a blanking aperture 19, a lower group of coils 20, a lower octapule 21 and a magnetic objective lens 22. The charged particle beam can also be diverted to a Farady cup 18.

The inspection path includes the magnetic objective lens 22, the lower octapule 21, the lower group of coils 20, beam bending electrodes 24, an electrostatic quadrapule 26, an electrostatic focus lens 28, a grounded aperture 30, an electrostatic filter 32 and a detector 34.

Various components of portion 10 receive high voltage supply from a high voltage module 40. Various components, and especially magnetic components receive current from a current supply module 42.

The focal points of the charged particle beam can be changed (modulated) by various components of the illumination path such as the upper and lower group of coils 17 and 20, the upper and lower octupoles 12 and 21. Fine focal point changes are usually achieved by the octupoles.

Typically, the inspection system also includes a stage, image processors, a vacuum chamber, optical components, man machine interface and the like. The charged particle beam propagates through vacuum.

Figure 2:
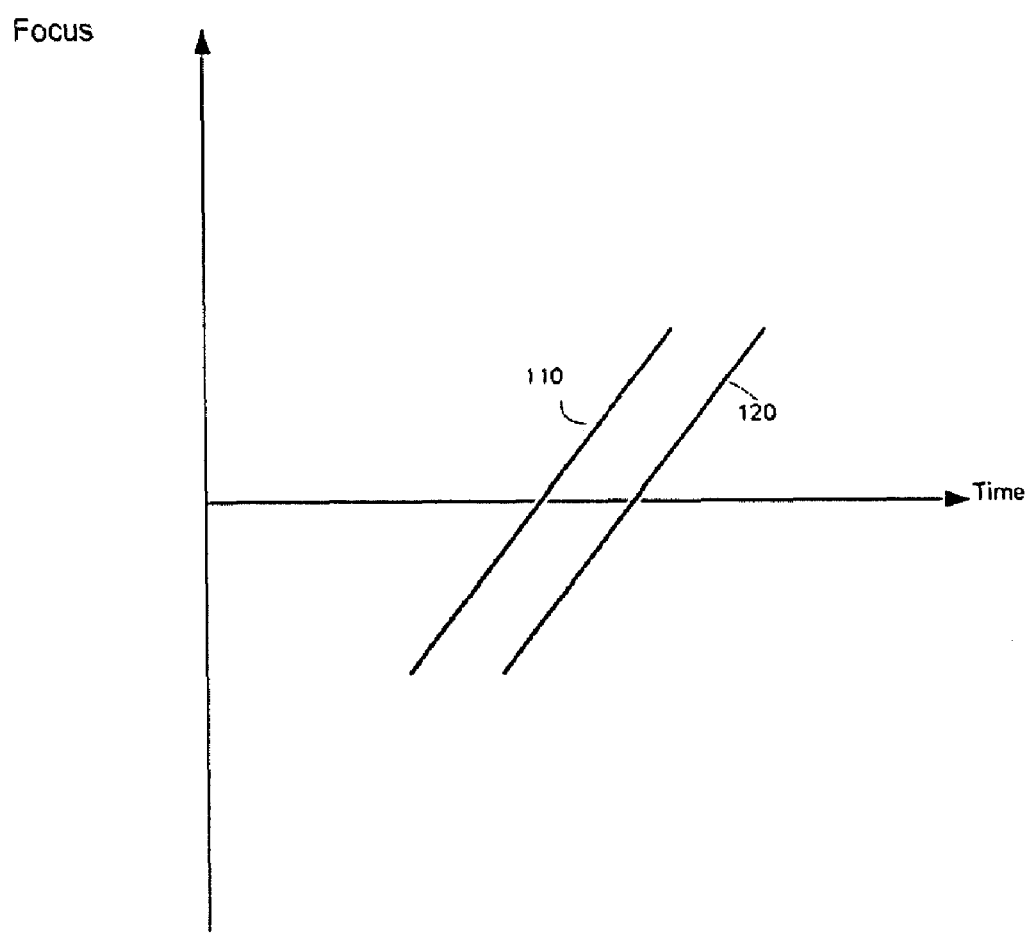
FIG. 2 illustrates a first focal pattern and a second focal pattern, according to an embodiment of the invention.

FIG. 2 illustrates a first focal pattern 110 and a second focal pattern 120 according to an embodiment of the invention.

FIG. 2 illustrates ideal focal patterns that ignore various inaccuracies in the sample or in the scanning process. It is noted that the distance between the sample and the optics of the charged particle beam can change during the scanning of the sample due to various results such as curvature sample surface, stage inaccuracies and the like.

Conveniently, a focal pattern that is applied during a scanning process is also responsive to the various sample and inspection system inaccuracies and deviations.

Due to various reasons, including sample manufacturing inaccuracies, inspection system mechanical inaccuracies (such as stage curvature) the distance between the sample and the inspecting system optics changes. When using high-resolution inspection even sub-micron height changes can affect the focus. Typically, in order to adjust the focus these changes a preliminary mapping of the sample (as being conveyed by the stage of the inspection system) takes place. Although this map reflects both sample and inspection system deviations this map is referred to as a sample map.

This preliminary mapping is relatively accurate and time consuming. A set of mapping locations of the sample is selected. In each mapping location a charged particle beam is directed towards the sample and is inspected, while altering the focal point changes, in order to locate the optimal focal point. After the focal point is found the focal point of the various mapping locations are processed (for example by extrapolation) in order to provide a map of focal changes. It is noted that various prior art method for performing mapping can be applied, including fringe base methods and the like.

Conveniently, one or more "general" focal patterns, such as focal patterns 110 and 120, are determined. These "general" focal patterns are adjusted according to the mapping of each sample, to provide a unique focal pattern that can be applied while a certain sample is scanned.

Once such a mapping is achieved the focal pattern that is applied during the focus correction sequence is responsive to the mapping and to the mentioned above focal patterns.

FIG. 2 illustrates the change of focal point (represented by a control signal that controls the focal point of the system) while the charged particle beam is scanned along an imaginary Y axis. It is noted that during this scan the sample is usually moved along an imaginary X axis. It is noted that more than a single control signal can be used in order to provide the desired focal pattern.

Both focal patterns 110 and 120 are sloped lines that differ from each other by the optimal focal point. The optimal focal point is theoretically located at the crossing between a curve and the horizontal axis.

Figure 3:
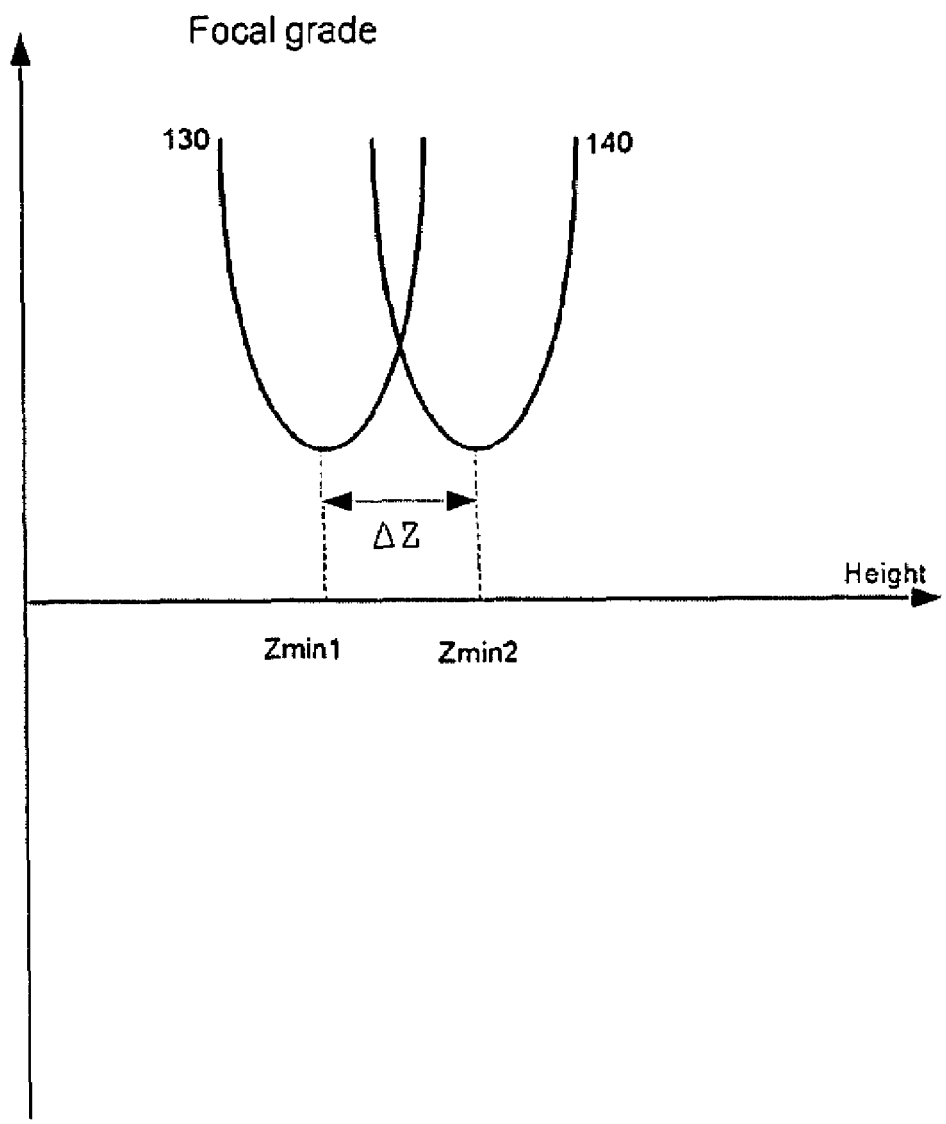
FIG. 3 illustrates the relationship between the focus grades associated with the first and second curves of FIG. 1.

FIG. 3 illustrates the relationship between focus grades associated with the first and second curves 110 and 120 of FIG. 1.

The focal grade reflects deviations from an optimal focal point, assuming that a focal pattern such as focal pattern 110 and focal patterns 120 are applied. Curve 130 illustrates the focal grade achieved from applying the first focal pattern 110 and curve 140 illustrates the focal grade achieved from applying the second focal pattern. It is noted that the focal grade differs as a result of the known difference between the focal pattern and also as a result of the unknown focus difference between the scanning of the first and second area. This unknown focal difference has to be found.

Conveniently, two focus grades are generated from each focal pattern.

The focal grade is responsive to the square of the focal error and is symmetrical in relation to the optimal focal point. Accordingly, curve 130 and curve 140 have a parabolic shape.

The horizontal displacement between the two parabolas is responsive to the shift between the first and second focal patterns and to the unknown focus difference between the scans. The horizontal displacement is measured and used to determine the focus correction signal. Assuming that: (a) the optimal focal point is located at point where these two parabolas cross each other and, (b) an optimal focal point of each curve is located at the parabola center (or minimum), then the optimal focal point can be found by: (i) finding the minimal point of one parabola and storing the corresponding height value (Z min1), (ii) determining the horizontal displacement between the parabolas (ΔZ), and (iii) either adding (from the minimum of curve 130) or subtracting (from the minimum of curve 140) half of the horizontal displacement to or from the minimal point.

Typical illumination path components introduce aberrations, thus the location of the focal point differs along the Y axis and along the X axis. In order to determine the proper focal points the method generates two gradient images—one along the x-axis and another long the Y axis.

Figure 4:
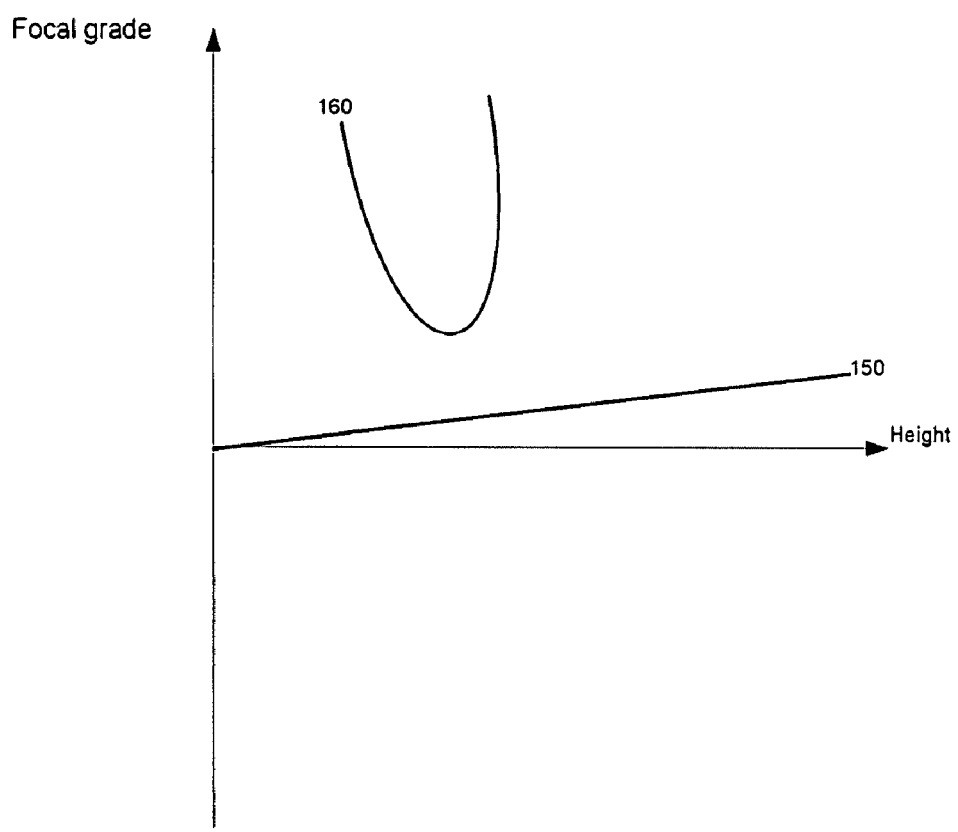
FIG. 4 illustrates a focal pattern that is responsive to focal mapping, according to an embodiment of the invention.

FIG. 4 illustrates a focal pattern 160 that is responsive to a mapping of a sample, according to an embodiment of the invention.

As previously mentioned focal patterns are adjusted according to the mapping of a sample.

First focal pattern 160 is a superposition of a linear mapping curve 150 that represent a linear portion of the sample mapping and of first linear curve 130.

The first focal pattern includes large deviations from the optimal focus. In order to prevent large gaps in the coverage of a scanned sample the first focal pattern is relatively short and steep. Thus, only a small area of the sample is scanned out of focus.

According to another embodiment of the invention the focal pattern includes minor height changes. These minor changes do not prevent the acquisition of images from the sample, thus then can be implemented during the inspection phase, without forming gaps in the image. Conveniently, these changes can be applied over large areas of the sample, but this is not necessarily so.

The inventors users a sinusoidal focal pattern that included relatively small focus deviations. This sinusoidal pattern was added to a map of the sample.

Figure 5:
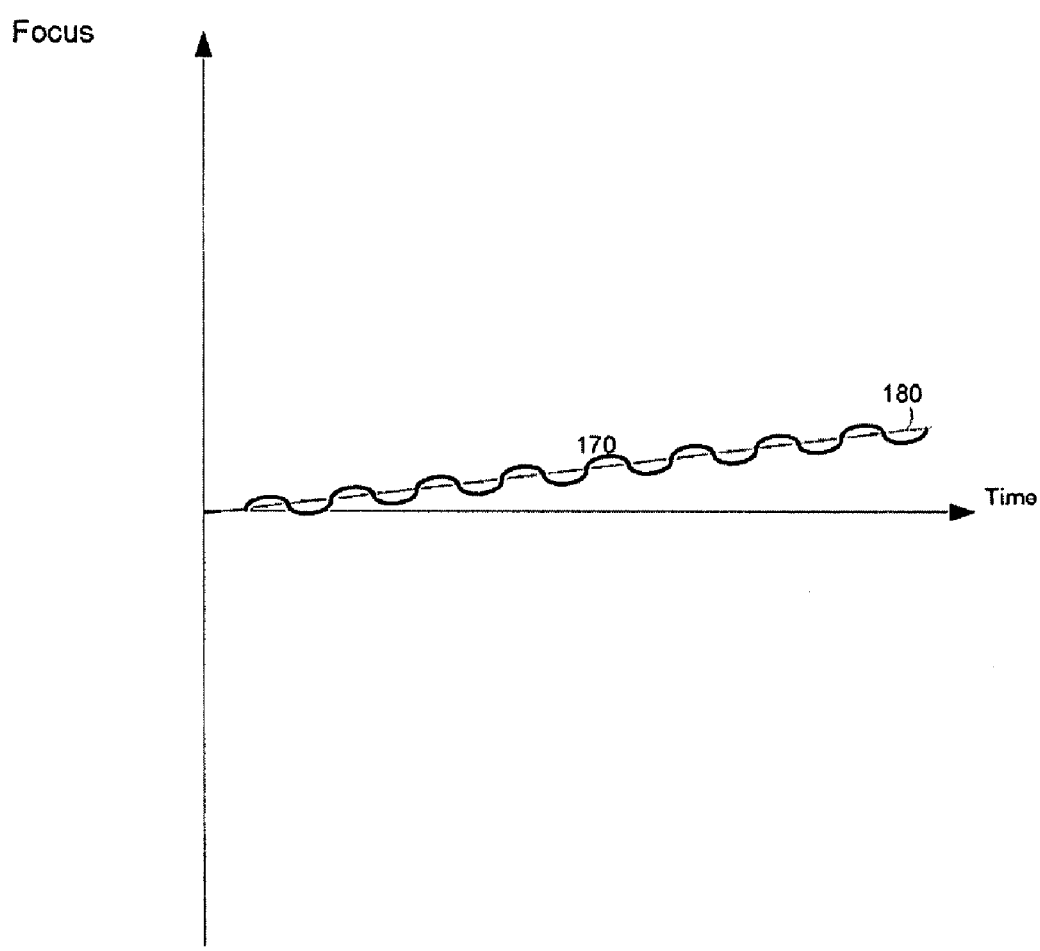
FIG. 5 illustrates a sinusoidal focal pattern and a linear mapping pattern, according to an embodiment of the invention.

FIG. 5 illustrates a sinusoidal focal pattern 170 and a linear mapping pattern 180, according to an embodiment of the invention.

The actual focal pattern 190 is a superposition of both patterns.

Figure 6:
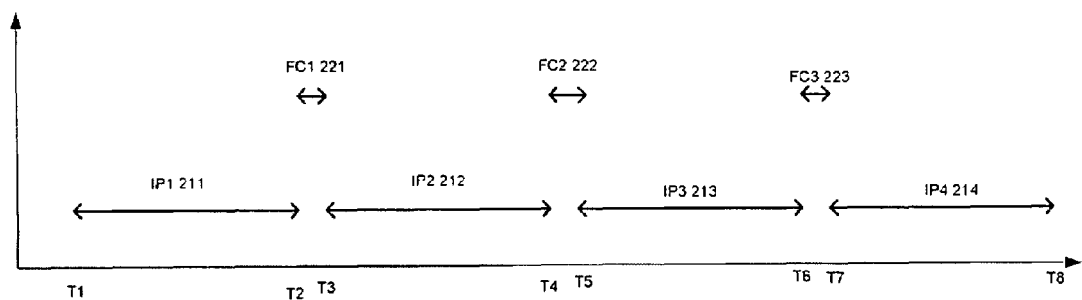

FIG. 6 includes a timing diagram 200 illustrates the timing of inspection periods and short focus correction periods according to an embodiment of the invention.

For convenience of explanation timing diagram 200 illustrates four inspection periods (IP1-IP4 211-214) and three focus correction periods (FC1-FC3 221-223), but the number of periods can change. It is also noted that the length of each period can differ from the other. Conveniently the inspection periods are longer and even much longer than the focus correction periods.

The inspection periods and the focus correction period are interlaced. Each focus correction period is timed between two inspection periods. The first, second and third inspection periods IP1-IP3 211-214 are followed by the first, second and third focus correction periods FC1-FC3 221-223 accordingly. IP1, FC1, IP2, FC2, IP3, FC3 and IP4 start at times T1, T2, T3, T4, T5 and T6. IP4 ends at T7.

It is assumed that at T1 mapping of the sample is completed.

During the first inspection period IP1 211 the focus is altered according to the sample mapping and a first portion of the sample is imaged.

The focus alterations can also be responsive to pervious focus correction periods, for example of focus correction periods that were applied during pervious scans of the sample, scans of other stripes of the sample and the like.

During each focus correction period (FC1-FC3) the focus is changed according to a focal pattern that can be responsive to the mapping of the sample and also allows to correct focus. Conveniently, each focal pattern includes under-focus points as well as over-focus points.

The focus during each of inspection periods IP2-IP4 is responsive to the mapping of the sample but is also responsive to the results of the preceding focus correction period. Conveniently, before such an inspection period starts (or immediately after such a period begins) the focus is corrected in response to the results of the pervious focus correction period.

Figure 7:
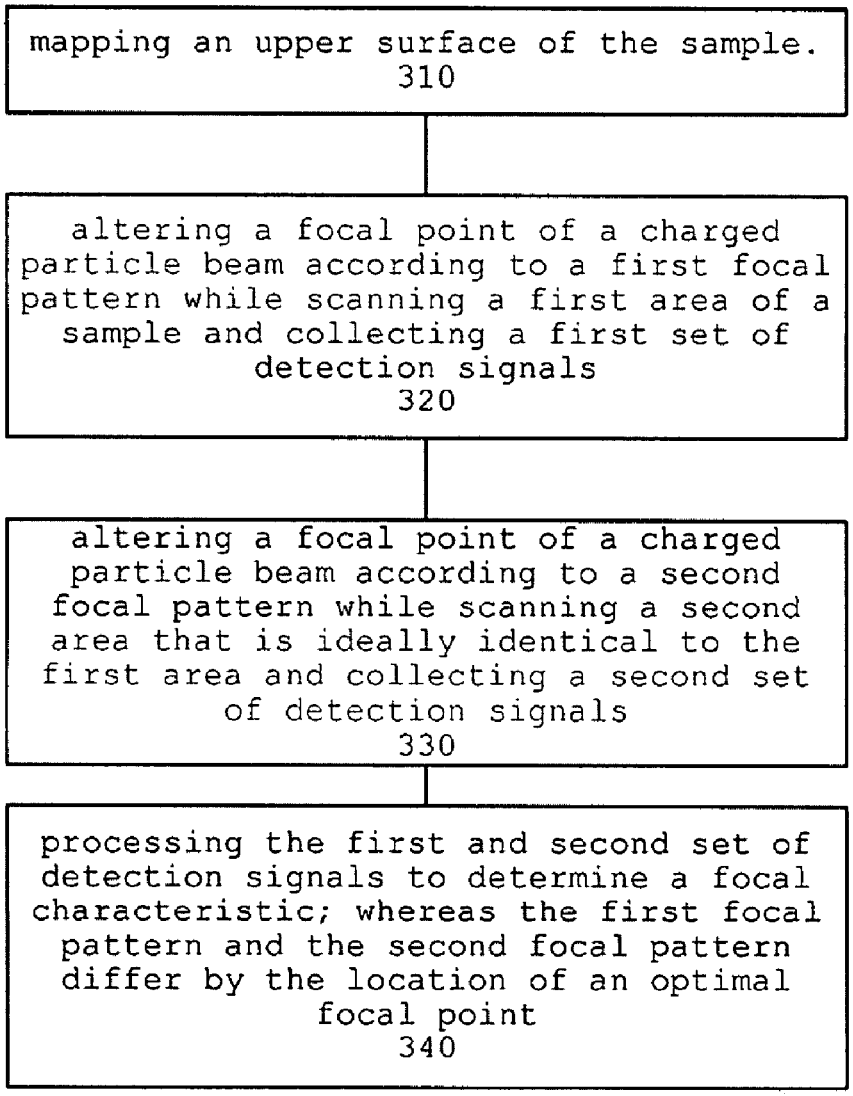
FIG. 7 is a flow chart illustrating a method for focusing a charged particle beam, according to an embodiment of the invention.

FIG. 7 is a flow chart illustrating a method 300 for focusing a charged particle beam, according to an embodiment of the invention.

Method 300 starts by stage 310 of mapping an upper surface of the sample.

Stage 310 is followed by stage 320 of altering a focal point of a charged particle beam according to a first focal pattern while scanning a first area of a sample and collecting a first set of detection signals. The first set of detection signals can form an image of be representative of an image of the scanned first area. Conveniently, the image of the first area is denoted $I_1(i,j)$.

Conveniently, the first focal pattern includes under-focus points and over-focused points.

Stage 320 is followed by stage 330 of altering a focal point of a charged particle beam according to a second focal pattern while scanning a second area that is ideally identical to the first area and collecting a second set of detection signals. The second set of detection signals can form an image of be representative of an image of the scanned second area. Conveniently, the image of the second area is denoted $I_2(i,j)$.

According to an embodiment of the invention the altering includes a mechanical translation. Conveniently, the alteration can include an alteration of a characteristic of an illumination path through which the charged particle beam propagates. Conveniently, the altering is responsive to an estimated distance between at least one element of a charged beam device and between the surface of the sample.

Conveniently, stages 320 and 330 are repeated various times, during the imaging of the sample. It is noted that during each repetition a new image is acquired. Conveniently, stages 320 and 330 are also repeated such as to collect a third set of detection signals from a third area that is ideally identical to the first area; and wherein the processing further includes processing the third set of detection signals.

Conveniently, method 300 also includes scanning a reference area that is ideally identical to the first area while maintaining a substantial constant focal point to collect a reference set of detection signals; and wherein the processing further includes processing the reference set of detection signals.

Conveniently, the first area includes multiple non-continuous segments. Conveniently, the area includes multiple segments and the focal point is maintained substantially fixed in relation to a surface of the sample while scanning a single segment.

According to various embodiments of the invention the focal pattern can have many shapes. It can be continuous or non-continuous. Conveniently, the shape of the focal pattern is determined in response to the inspection system characteristics and especially to the response time of the focal changing elements. The inventors used ramp shaped focal patterns and sinusoidal shaped focal patterns but other shapes as well as combination of various shapes can be used.

Conveniently, stages 320 and 330 are executed during an inspection session of the wafer. According an embodiment of the invention the first focal pattern is applied during an inspection session of the sample. Conveniently, the first focal pattern is applied during focal correction sessions between inspection sessions of the sample.

According to an embodiment of the invention the first area includes a first group of sub-areas and wherein the second area includes a second group of sub-areas. Conveniently, the processing includes processing detection signals from each sub-area to provide a sub-area grade and determining the focus characteristic in response to the grades of each sub-area.

Stage 330 is followed by stage 340 of processing the first and second set of detection signals to determine a focal characteristic; whereas the first focal pattern and the second focal pattern differ by the location of an optimal focal point.

According to an embodiment of the invention stage 340 includes estimating a focal change along a first axis (such as an imaginary Y axis) and along a second traverse axis (such as an imaginary X axis). Conveniently, the focal characteristic is determined in response to the focal change along a first axis and in response to a focal change along the second axis. Conveniently, stage 430 involves generating two gradient images of the first area and a two gradient image of the second area.

Conveniently, stage 340 includes: (i) generating a first axis gradient image of area; (ii) generating a second axis gradient image of the first area; (iii) calculating a focal grade of the first axis gradient image of the first area; and (iv) calculating a focal grade of the second axis gradient image of the first area.

Conveniently, stage 340 includes: (i) generating a first axis gradient image of the second area; (ii) generating a second axis gradient image of the second area; (iii) calculating a focal grade of the first axis gradient image of the second area; (iv) calculating a focal grade of the second axis gradient image of the second area; (v) comparing between the focal grade of the first axis gradient image of the first area and between focal grade of the first axis gradient image of the second area; and (vi) comparing between the focal grade of the second axis gradient image of the first area and between focal grade of the second axis gradient image of the second area.

Assuming that the gradient images are denoted $G_{x1}$, $G_{x2}$, $G_{y1}$ and $G_{y2}$, that the focus grades are calculated per line and are denoted $FocusGrade_{x1}(line\_j)$, $FocusGrade_{x2}(line\_j)$, $FocusGrade_{y1}(line\_j)$ and $FocusGrade_{y2}(line\_j)$ then the following mathematical terms represent the first stages of the mentioned above processes:

$$G_{x1}(i, j) = \frac{\partial I_1(i, j)}{\partial x}, G_{y1}(i, j) = \frac{\partial I_1(i, j)}{\partial y}$$

$$G_{x2}(i, j) = \frac{\partial I_2(i, j)}{\partial x}, G_{y2}(i, j) = \frac{\partial I_2(i, j)}{\partial y}$$

$$FocusGrade_{x1}(line\_j) = \sum_j |G_{x1}(i, j)|^2$$

$$FocusGrade_{y1}(line\_j) = \sum_j |G_{y1}(i, j)|^2$$

$$FocusGrade_{x2}(line\_j) = \sum_j |G_{x2}(i, j)|^2$$

$$FocusGrade_{y2}(line\_j) = \sum_j |G_{y2}(i, j)|^2$$

The focus grade of a certain line is proportional to the focus grade at the best focus point and to the square of the height deviation from that According to an embodiment of the invention the method can be applied on a sample that includes multiple repetitive patterns (cells). A first focal pattern can be applied while scanning a first group of repetitive patterns (cells) and a second focal pattern can be applied while scanning a second group of repetitive patterns (cells). In such a case the previously stages can be applied but according to another embodiment of the invention instead of selecting the best line in a image the method can select the best cell. The focus error can be calculated by comparing the location of the best cells.

The present invention can be practiced by employing conventional tools, methodolgy and components. Accordingly, the details of such tools, component and methodology are not set forth herein in detail. In the previous descriptions, numerous specific details are set forth, such as shapes of test structures and materials that are electro-optically active, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An inspection system, comprises: (i) illumination optics, adapted to alter a focal point of a charged particle beam according to a first focal pattern that varies with time while scanning a first area of a sample; and adapted to alter a focal point of a charged particle beam according to a second focal pattern that varies with time while scanning a second area that is ideally identical to the first area; (ii) at least one detector adapted to provide a first set of detection signals resulting from the scanning of the first area and adapted to provide a second set of detection signals resulting from the scanning of the second area; and (c) a processor, adapted to process the first and second set of detection signal s to determine a focal characteristic; whereas the first focal pattern and the second focal pattern differ over time by the location of an optimal focal point.

2. The system according to claim 1 wherein the first focal pattern comprises under-focus points and over-focused points.

3. The system according to claim 1 further adapted to repeat stages (a) and (b) such as to collect a third set of detection signals from a third area that is ideally identical to the first area; and wherein the processing further comprises processing the third set of detection signals.

4. The system according to claim 1 further adapted to scan a reference area that is ideally identical to the first area while maintaining a substantial constant focal point to collect a reference set of detection signals; and wherein the processor is further adapted to process the reference set of detection signals.

5. The system according to claim 1 wherein the processor estimates a focal change along a first axis and along a second traverse axis.

6. The system according to claim 5 wherein the focal characteristic is determined in response to the focal change along a first axis and in response to a focal change along the second axis.

7. The system according to claim 1 wherein the processor generates a gradient image of the first area and a gradient image of the second area.

8. The system according to claim 1 wherein the alteration comprises a mechanical translation.

9. The system according to claim 1 wherein the alteration comprises an alteration of a characteristic of an illumination path through which the charged particle beam propagates.

10. The system according to claim 1 wherein the alteration is responsive to an estimated spatial relationship between at least one element of a charged beam device and between the surface of the sample.

11. The system according to claim 1 further adapted to map an upper surface of the sample.

12. The system according to claim 1 wherein the first area comprises multiple non-continuous segments.

13. The system according to claim 1 wherein the area comprises multiple segments and wherein the focal point is maintained substantially fixed in relation to a surface of the sample while scanning a single segment.

14. The system according to claim 1 wherein the processor is adapted to: generate a first axis gradient image of the first area; generate a second axis gradient image of the first area; calculate a focal grade of the first axis gradient image of the first area; and calculate a focal grade of the second axis gradient image of the first area.

15. The system according to claim 14 wherein the processor is adapted to: generate a first axis gradient image of the second area; generate a second axis gradient image of the second area; calculate a focal grade of the first axis gradient image of the second area; calculate a local grade of the second axis gradient image of the second area; compare between the focal grade of the first axis gradient image of the first area and between focal grade of the first axis gradient image of the second area; and compare between the focal grade of the second axis gradient image of the first area and between focal grade of the second axis gradient image of the second area.

16. The system according to claim 1 wherein the focal pattern comprises a ramp.

17. The system according to claim 1 wherein the focal pattern comprises limited focal changes.

18. The system according to claim 1 adapted to alter the focal point during an inspection session of the sample.

19. The system according to claim 1 wherein system is adapted to apply the first focal pattern during an inspection session of the sample.

20. The system according to claim 1 wherein the system is adapted to apply the first focal pattern during focal correction sessions between inspection sessions of the sample.

21. The system according to claim 1 wherein the first area comprises a first group of sub-areas and wherein the second area comprises a second group of sub-areas.

22. The system according to claim 1 wherein the processing comprises processing detection signals from each sub-area to provide a sub-area grade and determining the focus characteristic in response to the grades of each sub-area.

* * * * *